METHOD OF PRODUCING ELECTRICAL COMPONENTS

Filed April 13, 1948 2 SHEETS—SHEET 1

INVENTOR

Paul Eisler

BY G. E. Oidell

ATTORNEY

Jan. 15, 1952 P. EISLER 2,582,685

METHOD OF PRODUCING ELECTRICAL COMPONENTS

Filed April 13, 1948 2 SHEETS—SHEET 2

INVENTOR

Paul Eisler.

BY A. E. O'Dell

ATTORNEY

UNITED STATES PATENT OFFICE 2,582,685

METHOD OF PRODUCING ELECTRICAL COMPONENTS

Paul Eisler, London, England, assignor to Hermoplast Limited, London, England, a corporation of Great Britain Application April 13, 1948, Serial No. 20,813
In Great Britain April 15, 1947

15 Claims. (Cl. 117—8)

This invention is concerned with the production of electric circuits or parts of electric circuits mounted on an insulating support, which for convenience and on account of the form in which they are produced by the invention, will be referred to as conductive patterns or simply as patterns.

The simplest forms of such patterns are such as can be laid out on a surface, generally a plane surface, but several such patterns can be superposed, or plane patterns can be bent, folded, twisted or otherwise brought into three dimensional forms. Also such patterns may consist only of conductors intended to connect components, or it may include such components as lend themselves to production by the methods of the invention, among which may be mentioned condenser electrodes, inductances, and contacts. And the patterns made according to the invention can be used in conjunction with patterns or separate conductors made in other ways.

In its widest aspect, the method according to the invention includes the steps of applying to areas of a fusible metal layer on an insulating support, a surface of such characteristics and raising the temperature of the areas to be removed to such an extent that the areas fuse or liquify and develop a preferential attraction for the applied surface. In this way the areas in question are removed from the support and a pattern will be left on the support which is a negative of the removed areas. This pattern may be either the desired final pattern or a pattern which represents a stage in the production of the final pattern. The "surface" may be that of a solid tool or that of molten metal brought in contact with the areas in a suitable way, for instance, by submerging them in a bath or by tools carrying the molten metal on their faces or by a flow of molten metal given access to the areas.

The invention will be further described with reference to the accompanying drawings which are of a diagrammatic nature.

All the drawings are diagrammatic and for convenience the thicknesses of certain details have been exaggerated. Like references indicate like details throughout.

Figure 1:
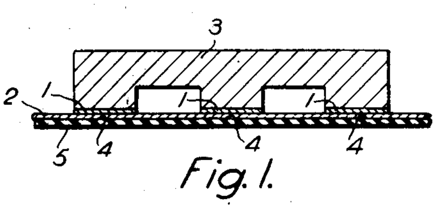
Figures 1 and 2 illustrate one way of practising the invention.
Figure 2:
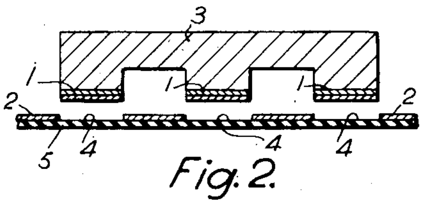

The process of the present invention may be regarded in some respects as the localised "detinning" of a "tin" layer on an insulating support, using the term "tin" not as the name of a specific metal but similarly to the sense in which it is used in the soldering art. The techniques already well established in that art can be drawn upon in practising the present invention. Thus as indicated in Figures 1 and 2 the applied surface 1 may be a "tinning" having an affinity for the fusible metal 2 and carried by a solid member or tool 3 (equivalent in effect to a soldering bit), the "tinning" being brought before, at or after the time of application to the areas such as 4 to a temperature relatively well above its solidification point, remaining substantially at this temperature or being cooled so as to be nearer to solidification point at the time of separation. Figure 1 shows the "tinning" 1 applied to the fusible metal 2 which is carried by an insulating support 5 while Figure 2 shows the tool and support separated. That part of the metal 2 which was on the area 4 is now carried by the "tinning" 1 and will in general have amalgamated or alloyed therewith, leaving the area 4 bare of metal.

Figure 3:
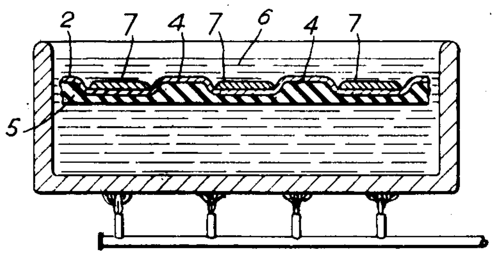
Figures 3 and 4 illustrate a second way of practising the invention.
Figure 4:
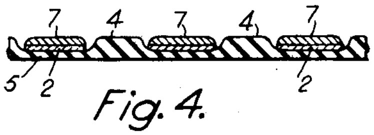

Alternatively as shown in Figures 3 and 4 the applied surface may be that of a bath 6 of molten metal (single or alloyed) having an affinity for the fusible metal, that is to say, easily fusing together with the fusible metal at the bath temperature; in that case those areas of the fusible metal which are not to be removed must be protected from contact with the bath, for instance by a coating 7 of suitable material. While in the bath the areas of metal to be removed alloy with or dissolve in the bath and when the support 5 has been removed from the bath, the areas such as 4 are bare of metal (Figure 4). In this alternative it is not desirable that there should be any cooling before the support 5 is withdrawn from the bath. The surface tension of the fused metal is high enough to prevent the bare areas of the insulating support being rewetted by metal when the support is withdrawn. The support should not have a rough surface to avoid cold metal particles from clinging to it after withdrawal through being caught by surface irregularities. The coating 7 can be in the nature of a paint or ink which could be applied by the methods of the printing art. For comparatively small quantities such coatings can be produced photographically, for instance, by exposure through a diapositive of the pattern of a bichromated gelatine coating over the fusible metal, and subsequent development. If need be the coating 7 can be removed from the finished pattern by suitable solvents or reagents.

Instead of a coating 7 produced by printing, a paper mask or stencil of suitable material may be pressed on the fusible metal layer while it is in contact with the molten metal in the bath or while it is flooded with molten metal squeeged over the mask. Techniques similar to stencilling and silk screen printing may be used. If the insulating support is flexible it may be stretched over a cylindrical support while in the bath to keep the mask or stencil pressed tightly on the fusible metal layer. Preferably the coated areas are also depressed below the areas to be removed as is indicated in Figures 3 and 4. The depression gives additional protection, helping to keep the pattern areas and the coating 7 or mask in position, and enabling any metal which may cling to the bare areas after withdrawal of the support from the bath or tool to be removed by simply wiping them off the support with a doctor blade or cloth. The depressing may be done by embossing when the coating 7 is printed or by pressing the mask or stencil down heavily onto the support.

In the above methods, where necessary or desirable the fusible metal may be fluxed, the areas not to be removed preferably being kept substantially free of flux. The above described protective coatings or masks for use with molten metal baths can be used to prevent or hinder access of flux.

Figure 5:
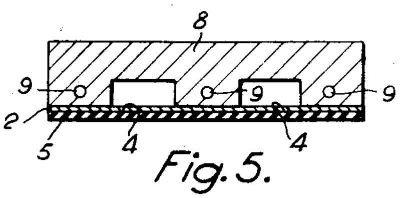
Figure 5 illustrates an auxiliary device.

As an additional precaution against removal of those areas which form part of the pattern, they may be kept not only from contact with the fused metal but also at a lower temperature than the areas to be removed. This effect is to a certain extent obtained automatically by the use of a heated solid "tinned" tool which may be designed to this end as will be explained below. Or a member 8 may be applied to these areas, as indicated in Figure 5, which may have passages for a cooling fluid shown at 9. As this member must interfit with a tool such as 3 of Figures 1 and 2 if such is used in analogy to an intaglio printing process rather than a bath as in Figures 3 and 4, it may be necessary in order to have members 3 and 8 adequately supported to effect the operations in two or more stages, bridge pieces (similar to those of a stencil) being left in the first operation which are removed in the second or subsequent operation.

A member such as 8 may also be used which presses the areas which are not to be removed, against the support while the other areas are being removed and maintains the pressure until their adhesion is again adequate. Such a measure is particularly useful if the fusible metal is held to the support by a thermoplastic adhesive.

A member such as 8 held against the areas not to be removed may serve simultaneously to effect any two or more of cooling, pressure, embossing, protection against flux, and protection against contact with a bath of molten metal.

Figure 6:
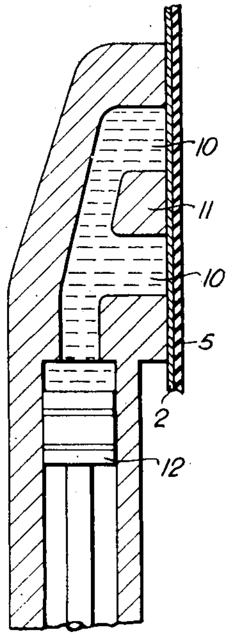
Figure 6 illustrates a modification of the method of Figures 2 and 3.

The removing effect of contact of the applied surface with the areas to be removed, of temperature and of separation of the surface and the support, may be reinforced by mechanical action. Alternatively the removal may be effected by drawing a device equivalent to a soldering bit over the areas to be removed thus adding something in the nature of a scraping action. A heated "tinned" pen or gang of pens or rollers may be used to produce the pattern by drawing. Where a molten bath is used this may be caused to flow in and out of openings 10 in member 11 (Figure 6) which covers the areas not to be removed, by which the bath 6 has access to the areas to be removed, and at the same time has an erosive or scouring effect. For the purpose of moving the molten metal, by way of example a piston 12 is shown; when this is raised the molten metal is driven through the openings 10, when it is lowered the metal runs out.

Figure 7:
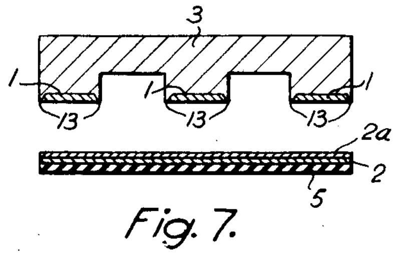
Figure 7 illustrates a modification of the invention.

The removing action may also be reinforced by an indenting or severing action at the edges of the areas to be removed. Such reinforcement is particularly applicable where the removal is effected by a "tinning" on a solid tool, which can be provided with slightly projecting edges 13 (Figure 7) at the edges of the areas to be removed; or similar edges can be provided on a solid member 8 pressed against the areas not to be removed. Desirably such edges should be of a material to which neither the fusible metal nor the "tinning" will adhere. For example chromium is of this nature and is hard.

Figure 8:
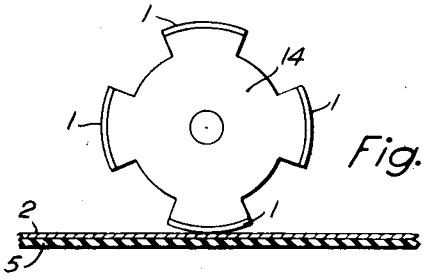
Figures 8 to 11 illustrate four further ways of practising the invention.
Figure 9:
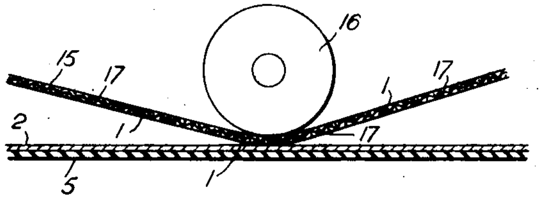
Figure 11:
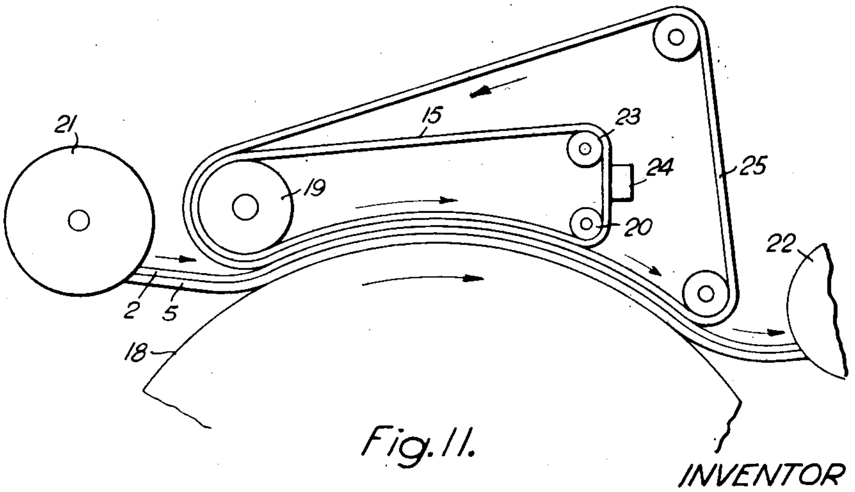

In most of the above cases it is possible to operate simultaneously over a substantial or the whole area of the support, but it is preferable to operate in a progressive manner as this enables a closer control to be maintained over temperature. In analogy to printing, to which art the present invention resembles in certain aspects, it is preferable to work on rotary rather than flatbed lines. Thus the surface may be applied by a roller being either a "tinning" 1 on the roller 14 itself (Figure 8) or on a separate, flexible, "tinned" member 15 applied by a roller 16 (Figure 9), the roller in both cases also serving to supply the necessary heat. Such a flexible member 15 may be of the same nature all over, e. g. wire gauze, those parts 17 which are not to be "tinned" being first coated with a heat-proof stencil or the like, the remainder then being "tinned" as at 1. Such stencil or the like coatings may be produced by well known photographic methods. Alternatively instead of using a stencil on the wire mesh 15, the fusible metal layer may have the remaining areas covered by a printed and embossed coating such as 7 (Figures 3 and 4) or a paper stencil or the like such as 25 in Figure 11 described below.

Such a method gives line contact, but a line so obtained may be too narrow and a "stripe" contact may be preferable. This can be obtained as indicated in Figure 10 by again using a flexible member 15 on which the surface 1 is formed and pressing this and the support 5 against a bed 18 by a lead-on guide or roller 19 and a lead-off guide or roller 20. The distance between these rollers determines the width of the "stripe" and may be adjustable. If the bed is flat actual pressure will only be obtained at the locations of the two rollers. If the support 5 is flexible, pressure can be obtained over the whole width of the strip by making the bed 18 as shown in the form of a roller of large diameter; such also enables the rollers 19, 20 to remain in stationary position, the support 5 being fed through the apparatus; a supply roller is indicated at 21 and a take-up roller at 22. The flexible member 15 carrying the "tinning" is shown in this example as endless, and passing over a third roller 23 which may be adjustable in position to allow the tension of the member 15 to be regulated. The lead-on roller 19 can conveniently serve as a heating member and the lead-off roller 20 as a cooling member. The metal taken up from the support 5 by the member 15 is automatically removed from the latter by a wiper indicated at 24. A suitable drive must be imparted to the take-up roller 22 and also to one or more of the other rollers. Where it is desirable to hold the unremoved metal pressed against the support after the support has passed beyond the lead-off roller 20, a flexible stencil 25 (Figure 11) may be used between the member 15 and the fusible metal 2. Such a stencil must in general have bridge pieces and if these prevent removal of certain parts of the fusible metal which should be removed, the pattern will have to be completed in more than one stage as mentioned above with reference to Figure 5. Such a stencil can also cause depression of the parts of the coating with which it contacts, similarly to the member 8 of Figure 5 producing an effect similar to that shown in Figures 3 and 4.

Figure 10:
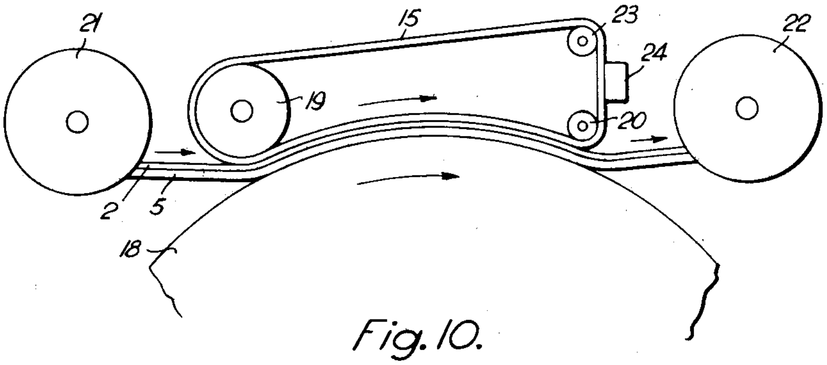

As above mentioned the invention in certain aspects is analogous to the printing art (though its purpose is "deprinting" rather than printing) and that art may be drawn upon as regards the preparation of the member or tool carrying the "tinning" and particularly for repetition production as regards machines for applying the tool to the fusible metal on the support and for separating them thereafter. Figure 10 above described is an example bearing a resemblance to printing methods. The members 3 of Figures 1 and 7 and the roller 14 of Figure 8 can be produced by methods used in printing, for instance similarly to line blocks but preferably with a surface capable of holding a relatively considerable quantity of fused metal. It is preferred however to make them thicker than usual in line blocks and to rout out or otherwise greatly deepen the grooves between the high parts in order to reduce the radiation of heat from these parts on to the fusible metal. Such radiation may be further reduced by coatings of heat insulating material of low heat emissivity. Another way to build up members such as 3 is from material similar to printers' rules.

Since metal is taken from the support on to the "tinned" member, the latter must have the excess metal removed by wiping at intervals depending on the capacity of the member and the thickness of the fusible metal on the support. In a machine built on the lines of a printing press, a wiping mechanism could be modelled on the inking mechanism. To increase the capacity of the "tinned" member to hold fused metal it may have a roughened or pitted surface such as a screen on a photogravure plate. Gauze flexible members in Figures 9 and 10 will clearly have such an increased capacity as compared with a smooth band. Where the contacting surface acts by fusing and alloying with the fusible metal layer at a temperature well below the melting point of the fusible metal layer itself, as can be done with a "tinned" solid member or more easily where the fusible metal layer is flooded with or submerged in a bath of a molten low melting point alloy containing a high proportion of the metal of the layer, additions to the molten alloy of the constituents not contained in the fusible metal layer are necessary from time to time so as to maintain it in the liquid state at the working temperature. Although it is possible to use a mercury bath or an amalgam bath with suitable flux to work the process at very convenient temperatures it is preferable particularly for the production of tin (using "tin" as the name of the metal) patterns to use a bath of tin-lead alloy or where still lower working temperatures are desirable a bath of tin-lead-bismuth or similarly constituted low melting point alloy and work them well in the liquid range. Notwithstanding this margin above the liquidus point of the bath, these low melting point alloys can be used so much below the melting point of tin that no particular measures for keeping the remaining areas of the tin layer cool are required.

As examples of insulating supports for many purposes paper is suitable, but card, glass fibre cloth and other textiles, or such materials impregnated with synthetic resins may be used, or sheets of synthetic resin, or even ceramic materials. The more heat resistant the insulating support the wider the range of fusible metal layers which can be used. The fusible metal may be secured to the support by any adhesive which is compatible with the method of removal of the metal which is characteristic of the invention. It can be thermoplastic and of reduced adhesiveness at the temperature of removal of the metal but should not contaminate the "tinned" surface, tool or bath by leaving the support; thus although bituminous adhesives are thermoplastic, they are not suitable whereas glue and some synthetic resins both thermoplastic and thermosetting are suitable. Hard setting adhesives not softened by the operating temperature are preferred however. The higher the surface tension of the fused metal in contact with the adhesive at the operating temperature and the smoother the surface of the adhesive when the fusible metal is removed the better.

As examples of the fusible metal tin has already been mentioned; lead, and tin-lead alloys are also suitable. Their current carrying capacity is adequate for many purposes, their fusion temperatures are convenient for practical use and are such as to avoid damage to a support of paper. There is a wealth of knowledge as to their behaviour and of suitable fluxes available in the soft-soldering art. A tin coated paper similar to that which has for long existed as a commercial product and is used for making rolled paper electrical condensers, but having a stouter base, can be used for practising the invention. Such tin coated paper (which for convenience will be referred to herein as friction coated paper) is prepared by friction calendering a mud or suspension of particles of tin in a weak solution of adhesive, and the tin layer is very thin. It is satisfactory however for patterns which have to carry only minute currents and is also suitable for preparing resistive patterns for use as fuses or for warming at low loading per unit area, for example as a wall paper for use in space warming. For heavier currents tin foil up to say two thousandths of an inch or so, secured to the base by adhesive may be used.

The patterns prepared according to the invention can be used among other things for the production of heating panels and weak current carrying wiring boards such as boards for electrical games and advertising signs, for signalling, telephone and wireless receiver circuits, and for windings of small electrical machines, magnets and transformers. They can be dealt with and used in the same manner as have already been proposed for so called printed electric circuits.

I claim:

1. A method of producing a metallic pattern upon a non-metallic support having an adherent coating of a metal which can be liquified at a temperature which will not damage the support, which method comprises applying a hot metal surface to such areas of said metal coating required to be removed from said support, said metal surface having an affinity for the metal covering the non-metallic support, at such a temperature and for such a time that on the areas where both surfaces meet all the metal on the non-metallic support becomes liquid and adheres to the applied surface by virtue of the preferential attraction of the liquid metal of said areas to the applied hot metal surface as against the attraction of the liquid metal to the non-metallic support when the support and the hot metal surface are separated, and removing the liquid metal from the support by separating said support and applied surface, leaving the desired metallic pattern on the non-metallic support.

2. A method as set forth in claim 1 in which the surface which is applied to the said areas is itself liquid metal.

3. A method as set forth in claim 2 in which the surface which is applied to the said areas is on a solid carrier.

4. A method as set forth in claim 1 in which the surface is applied to the said areas by means of a wire mesh.

5. A method as set forth in claim 1 in which the surface which is applied to the said areas is an alloy which contains the metal of the coating and is liquid at a temperature below the melting point of the coating.

6. A method as set forth in claim 1 in which the said areas are fluxed before application of said surface thereto with a soldering flux.

7. A method according to claim 1 in which the areas not to be removed from the support are protected by a covering at least while applying and removing said surface.

8. A method according to claim 1 in which the areas not to be removed are depressed to a level below that of the areas to be removed.

9. A method according to claim 1 in which during application of the surface and separation, the areas not to be removed are kept at a lower temperature than the areas being removed.

10. A method according to claim 1 in which the areas not to be removed are held pressed against the support during the removal of the other areas.

11. A method according to claim 1 in which the removing effect of contact, temperature and separation is reinforced by mechanical action.

12. A method according to claim 1 in which the fusible metal is tin.

13. A method according to claim 1 in which the support and the fusible metal layer are in the form of friction coated paper.

14. A method according to claim 1 in which the support is paper and the fusible metal is a layer of tinfoil secured thereon by adhesive.

15. A method according to claim 1 in which the fusible metal is lead.

PAUL EISLER.

REFERENCES CITED

The following references are of record in the file of this patent:

UNITED STATES PATENTS

| Number | Name | Date |
|---|---|---|
| 2,435,441 | Grouse | Feb. 3, 1948 |
| 2,441,960 | Eisler | May 25, 1948 |
| 2,447,541 | Sabee | Aug. 24, 1948 |

OTHER REFERENCES

Brunetti-Printed Circuit Techniques, National Bureau of Standards Circular 468, Nov. 15, 1947.